(12) United States Patent
Mastromatteo et al.

(10) Patent No.: US 6,350,657 B1
(45) Date of Patent: Feb. 26, 2002

(54) INEXPENSIVE METHOD OF MANUFACTURING AN SOI WAFER

(75) Inventors: Ubaldo Mastromatteo, Cornaredo-Milano; Flavio Villa, Milan; Gabriele Barlocchi, Cornaredo-Milano, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/359,870

(22) Filed: Jul. 26, 1999

(30) Foreign Application Priority Data

Aug. 3, 1998 (EP) .............................. 98830475

(51) Int. Cl.$^7$ .................... H01L 21/311; H01L 21/8222
(52) U.S. Cl. .................. 438/311; 438/410; 438/424; 438/427
(58) Field of Search ............................ 438/311, 410, 438/424, 427

(56) References Cited

U.S. PATENT DOCUMENTS

| | | | |
|---|---|---|---|
| 4,361,600 A | * 11/1982 | Brown | 438/410 |
| 4,685,198 A | 8/1987 | Kawakita et al. | 437/73 |
| 4,845,048 A | * 7/1989 | Tamaki et al. | 438/410 |
| 4,948,456 A | 8/1990 | Schubert | 156/611 |
| 5,726,480 A | * 3/1998 | Pister | 257/415 |

FOREIGN PATENT DOCUMENTS

| | | |
|---|---|---|
| GB | 2 156 149 A | 3/1984 |
| JP | 57154855 | 9/1982 |
| JP | 60249311 | 12/1985 |

* cited by examiner

Primary Examiner—Richard Elms
Assistant Examiner—Christian D. Wilson
(74) Attorney, Agent, or Firm—Lisa K. Jorgenson; Allen, Dyer, Doppelt, Milbrath & Gilchrist, P.A.

(57) ABSTRACT

A method of manufacturing an SOI (silicon on insulator) wafer includes the step of selective anisotropic etching to form, in the substrate, trenches which extend to a predetermined depth from a major surface of the substrate and between which pillar portions of the substrate are defined. The method further includes the step of selective isotropic etching to enlarge the trenches, starting at a predetermined distance from the major surface, thus reducing the thicknesses of the pillar portions of the substrate between adjacent trenches. Also, the method includes the steps of selective oxidation to convert the pillar portions of reduced thickness of the substrate into silicon dioxide and to fill the trenches with silicon dioxide, starting substantially from the predetermined distance, and epitaxial growth of a silicon layer on the major surface of the substrate. The method permits more freedom in the selection of the dimensional ratios between the trenches and the pillars and thus enables the necessary crystallographic quality of the epitaxial layer to be achieved, ensuring a continuous buried oxide layer.

25 Claims, 4 Drawing Sheets

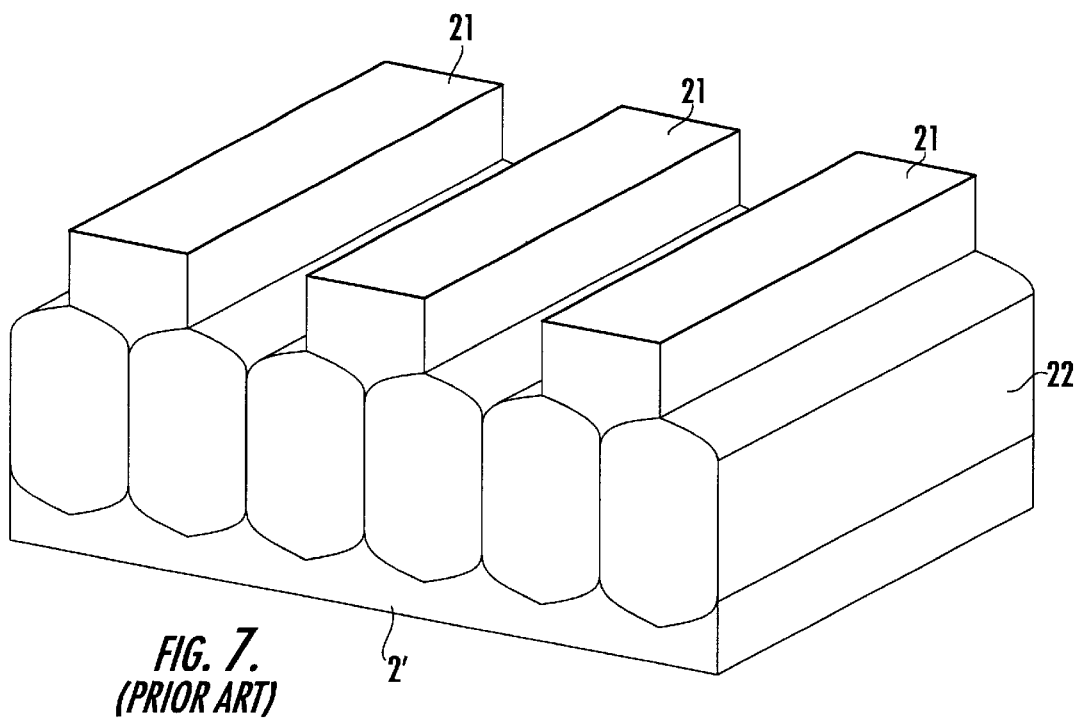
FIG. 7.
*(PRIOR ART)*
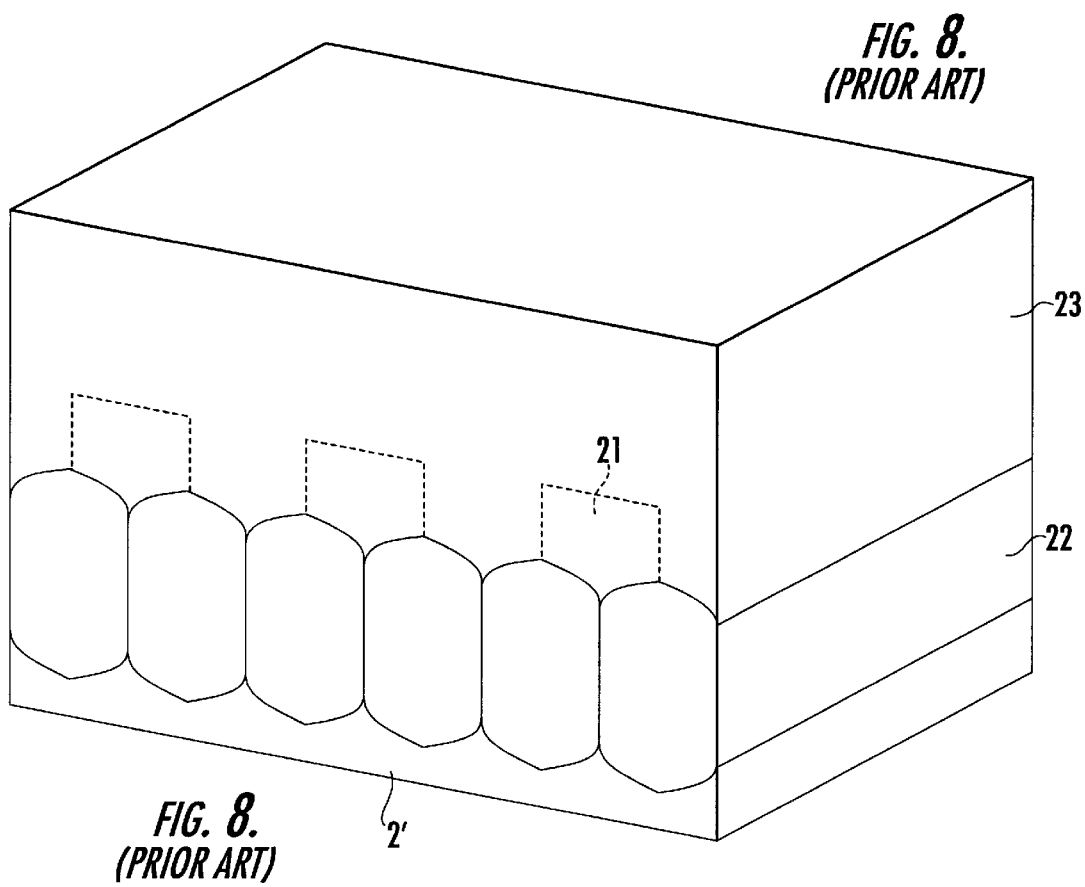
FIG. 8.
*(PRIOR ART)*
FIG. 8.
*(PRIOR ART)*

INEXPENSIVE METHOD OF MANUFACTURING AN SOI WAFER

FIELD OF THE INVENTION

The present invention relates to semiconductor wafers, and more particularly to a method of manufacturing a silicon on insulator (SOI) wafer from a monocrystalline silicon substrate.

BACKGROUND OF THE INVENTION

As is known in the microelectronics industry, monocrystalline silicon wafers are the most widely used substrate for the manufacture of electronic devices. As an alternative to silicon wafers, composite SOI wafers have been proposed which are formed of two silicon layers, one thinner than the other and separated by a silicon dioxide layer.

A method of manufacturing SOI wafers is the subject of European patent application No. 98830007.5 filed on Jan. 13, 1998 to the assignee of the present invention. A similar method is described below with reference to FIGS. 1 to 8.

First, a first silicon dioxide layer between 20 and 60 nm thick is grown on a major surface 3 of a substrate formed of a monocrystalline silicon wafer 2. Then a first layer of silicon nitride between 90 and 150 nm thick and a second silicon dioxide layer between 100 and 600 nm thick produced by decomposition of tetraethyl orthosilicate (TEOS), are deposited thereon. A resist layer and a masking operation are used to define in plan view, for example, a grid of rectangular areas. Dry etching of the uncovered portions of the TEOS oxide layer, of the first nitride layer, and of the first oxide layer is then carried out and the residual resist is then removed producing the structure shown in cross-section in FIG. 1. The portions of the first oxide layer, of the first nitride layer, and of the TEOS oxide layer remaining after the dry etching are indicated as 4, 5 and 6, respectively. Together these define protective plaques 7 covering portions 8' of the monocrystalline silicon substrate 2.

The protective plaques 7 form a mask, generally indicated 9, for subsequent selective anisotropic etching of the silicon substrate 2. This treatment etches the portions of the substrate 2 indicated 8", which are not protected by the mask 9, so that initial trenches 10 are formed (FIG. 2).

As shown in FIG. 3, the structure is then subjected to an oxidation step which leads to the formation of a third silicon dioxide layer 11, between 20 and 60 nm thick, which covers the walls and the bases of the initial trenches 10. A second silicon nitride layer 12 between 90 and 150 nm thick is then deposited.

The method continues with dry anisotropic etching without masking, during which the horizontal portions of the second silicon nitride layer 12 are removed. During the dry etching, the first nitride layer 5 is protected by the TEOS oxide layer 6. The third oxide layer 11 which is disposed in the bases of the initial trenches 10 is removed by a wet process. This produces the structure shown in FIG. 4, in which it is possible to see the portions 8', still covered on the top by the mask 9 and on the sides (on the vertical walls of the initial trenches 10) by portions 11' and 12' of oxide and nitride, respectively, and the uncovered bases 15 of the initial trenches 10.

Anisotropic etching of the silicon is then carried out with the use of the mask 9 modified by the addition of the oxide and nitride portions 11' and 12', respectively. The uncovered silicon in the bases 15 of the initial trenches 10 is etched for a predetermined period to give final trenches 16 having a desired depth. It will be noted that the difference between the depth of the final trenches 16 and that of the initial trenches 10 determines the dimensions of the buried oxide layer, and, hence, the electrical characteristics of the SOI wafer, as will be explained further below. The etching depths are therefore selected on the basis of the specifications of the SOI wafer to be produced.

The monocrystalline silicon substrate thus treated is now formed by a base portion, indicated 2', and by a plurality of pillars 18 extending from the base portion 2'. The structure shown in FIG. 5 is thus produced, in which the nitride portions 5 and 12' are no longer separate and are generally indicated 19, and the oxide portions 4 and 11' are generally indicated 20. The portions 19 and 20 with the overhanging TEOS oxide portions 6 together form a mask 30.

The silicon substrate is then subjected to selective oxidation with the use of the mask 30 to protect the silicon on the tops of the pillars 18 from oxidation. The process continues until the portions of the pillars 18 which are not protected by the mask 30 are completely converted into silicon dioxide. In practice, a gradual growth of the oxide regions takes place at the expense of the silicon regions, starting from the side walls of the final trenches 16, towards the interior of the pillars and partially also into the base portion 2'. Since the volume of silicon dioxide which is formed is greater than that of the initial silicon, the oxide regions being formed gradually occupy the space in the final trenches 16 until they close them completely and are joined together. The oxidation step terminates automatically when the pillars 18 are completely oxidized (naturally apart from their tops or tips 21, which are protected by the mask 30). A continuous oxide region 22 is thus formed, most of which is buried, as shown in FIG. 6, in which vertical lines indicate the surfaces on which the oxide regions join.

The TEOS oxide portions 6 and the nitride portions 19 and oxide portions 20 which form the mask 30 are then eliminated by selective etching so as to uncover the tips 21 which are intended to form the seeds for subsequent epitaxial growth. The resulting structure is shown in perspective in FIG. 7. The epitaxial growth step is performed in a manner such as to prevent nucleation of polycrystalline silicon in the uncovered areas of the buried oxide region 22. Moreover, a high lateral/vertical growth ratio is selected so as to achieve, first of all, growth of the silicon sideways around the tips 21 until the trench portions which are still open are filled, and then growth of an epitaxial layer 23 in a direction perpendicular to the major surface of the substrate. After an optional chemical-mechanical lapping or polishing step to level the surface of the layer 23, the final structure of the SOI wafer shown in FIG. 8 is obtained.

An SOI wafer is thus formed from a normal monocrystalline silicon substrate with the use of process steps which are common in microelectronics, with much lower costs than those of the methods currently used for the production of SOI wafers. However, the implementation of the method described above imposes constraints. To produce a continuous buried oxide layer it is necessary for the areas between adjacent trenches, which define the widths of the pillars, to be as narrow as possible. On the other hand, the minimum width of the pillars is fixed by the minimum thickness required for the residual monocrystalline silicon on the buried oxide layer (that is the tips 21 on the layer 22, with reference to FIG. 7), to ensure an adequate crystallographic quality of the epitaxial layer subsequently grown. Moreover, the widths of the pillars cannot be as large as may be desired but must be selected so as to ensure that the silicon disposed between adjacent trenches is completely converted into oxide. It is also necessary for the trenches to be as narrow as possible consistent with the thicknesses required by the method for the nitride and oxide layers deposited or grown. Finally, the known method described above is greatly limited by the dimensional ratios between the trenches and the pillars.

SUMMARY OF THE INVENTION

An object of the present invention is to provide a method of manufacturing an SOI wafer which is not limited by the dimensional ratios between the trenches and the pillars.

This and other objects can be achieved by the method according to the invention including the steps of: selective anisotropic etching to form trenches, in a monocrystalline silicon substrate, which extend to a predetermined depth from an upper surface of the substrate and which define portions of the substrate therebetween; selective isotropic etching to enlarge the trenches, beginning at a predetermined distance from the upper surface, thus reducing the thicknesses of the portions of the substrate between adjacent trenches; selective oxidation to convert the substrate portions of reduced thickness into silicon dioxide and to fill the trenches with silicon dioxide, substantially from the predetermined distance from the upper surface; and epitaxially growing a silicon layer on the upper surface of the substrate.

The selective anisotropic etching may comprise the formation of a mask of material resistant to etching and protective against oxidation of the silicon. After at least part of the anisotropic etching, the mask may extend to side walls of the trenches as far as the predetermined depth. Also the mask may comprise a silicon nitride layer and/or a silicon dioxide layer produced by decomposition of tetraethyl orthosilicate (TEOS). Additionally, the step of selective isotropic etching may be performed with xenon difluoride gas.

BRIEF DESCRIPTION OF THE DRAWINGS

The invention will be understood better from the following detailed description of an embodiment thereof described by way of non-limiting example, with reference to the appended drawings, in which:

FIGS. 1 to 8 show, in cross-section, a portion of an SOI wafer at successive stages of a prior art method.

DETAILED DESCRIPTION OF THE PREFERRED EMBODIMENTS

Figure 9:
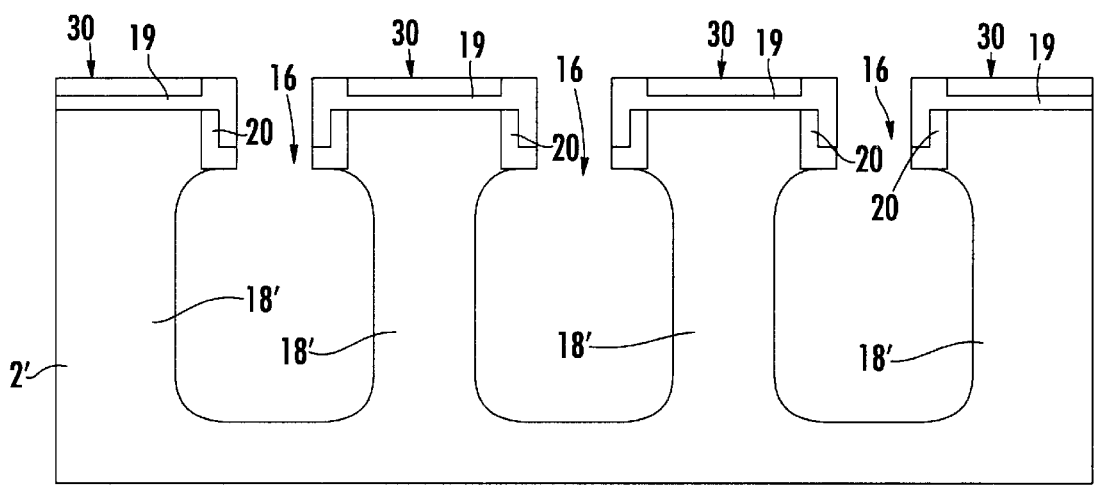
FIGS. 9 and 10 show, in cross-section, a portion of an SOI wafer at stages of the method according to the invention.

The method according to the invention differs from the prior art method described above in that, after the anisotropic etching to hollow out the final trenches 16 (FIG. 5), and before the selective oxidation of the pillars 18, the silicon substrate is subjected to selective isotropic etching. This etching reduces the thickness of the pillars 18, starting a certain distance from the front surface of the substrate 2, that is, from the boundary of the mask 30. As a secondary effect, the depth of the trenches 16 increases. The structure resulting upon completion of the isotropic etching is substantially that shown in cross-section in FIG. 9, in which the pillars of reduced thickness are indicated 18'.

Figure 1:
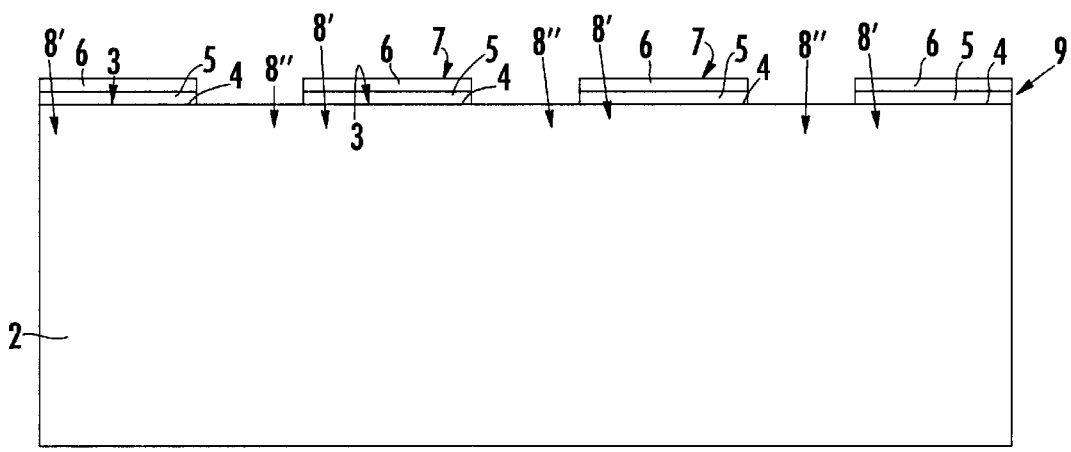
Figure 2:
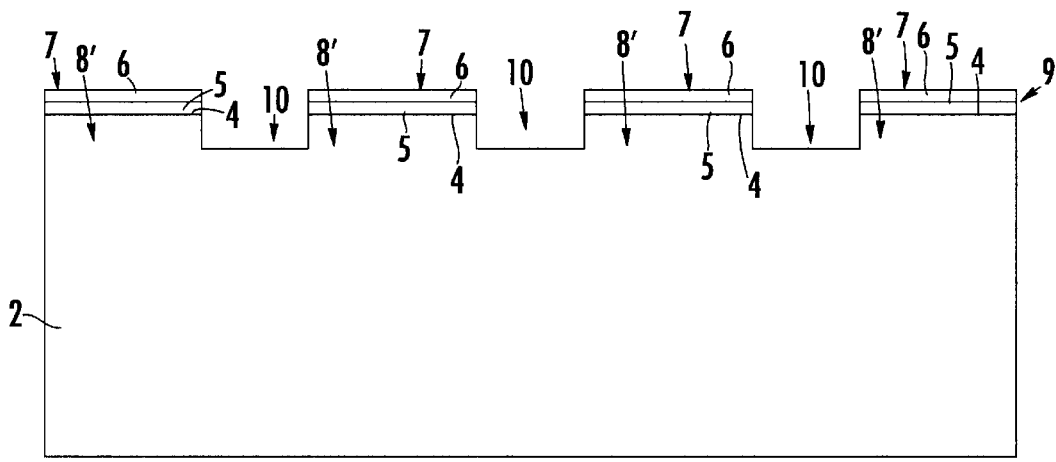
Figure 3:
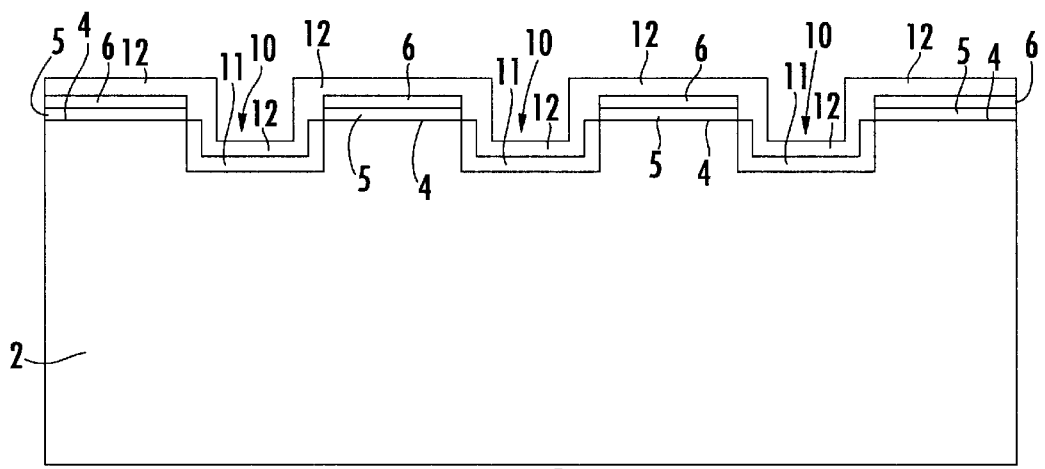
Figure 4:
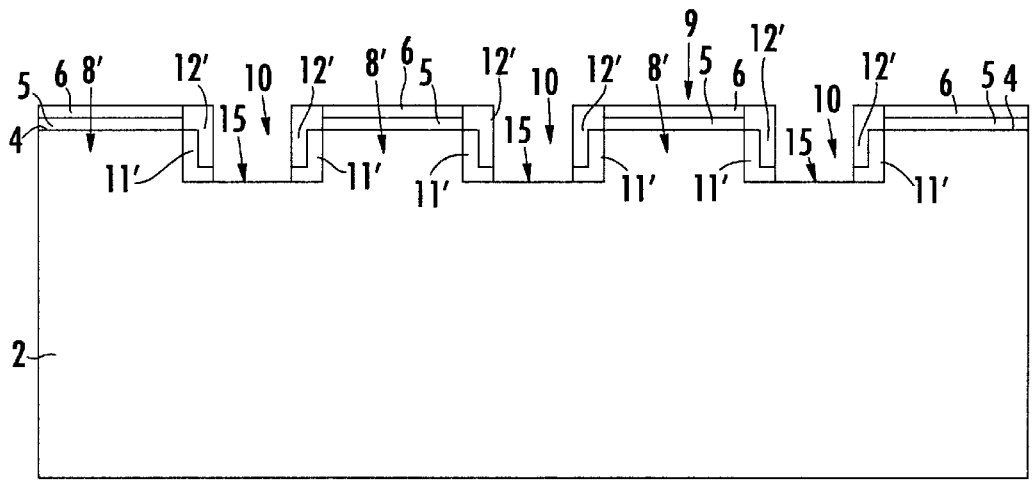
Figure 5:
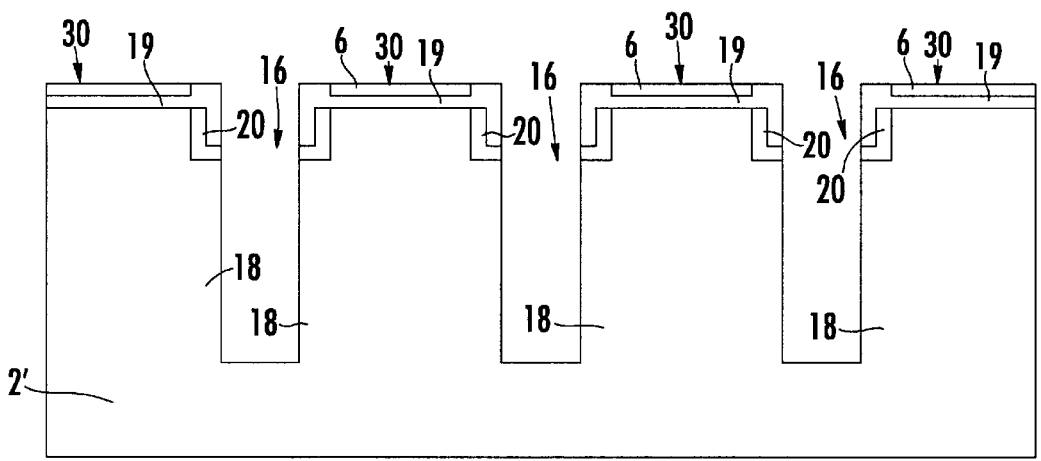

According to a preferred embodiment of the invention, the silicon substrate protected by the mask 30 as shown in FIG. 5 is exposed in a reactor to xenon difluoride ($XeF_2$) gas at ambient temperature with an etching rate of between 1 and 10 $\mu$m/min (depending on the geometry to be produced).

This type of etching is advantageous because it does not damage the silicon (as, for example, plasma etching does). It is extremely highly selective with respect to the oxide (greater than 50:1), and it can be used without problems with regard to the safety of personnel and the integrity of the equipment. Certainly, however, the method according to the invention may also be implemented with isotropic etching of other types.

Figure 6:
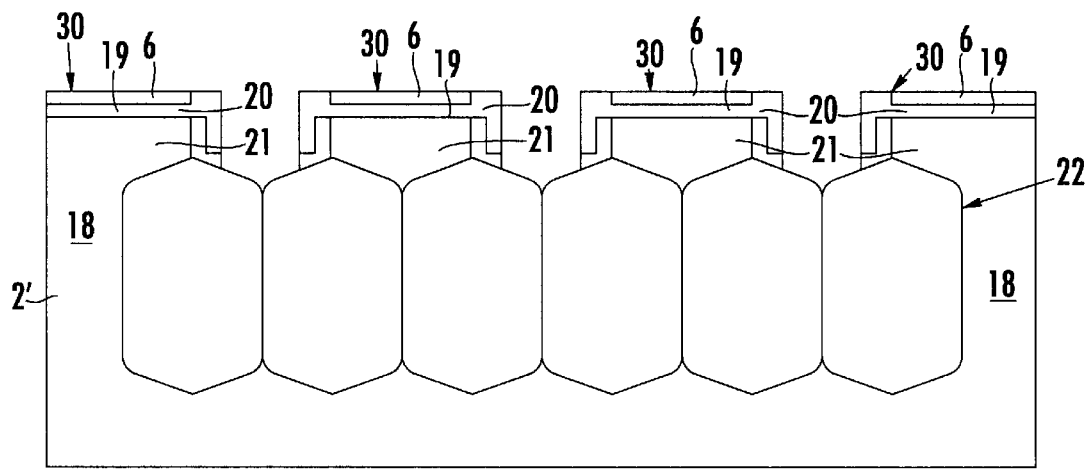
Figure 10:
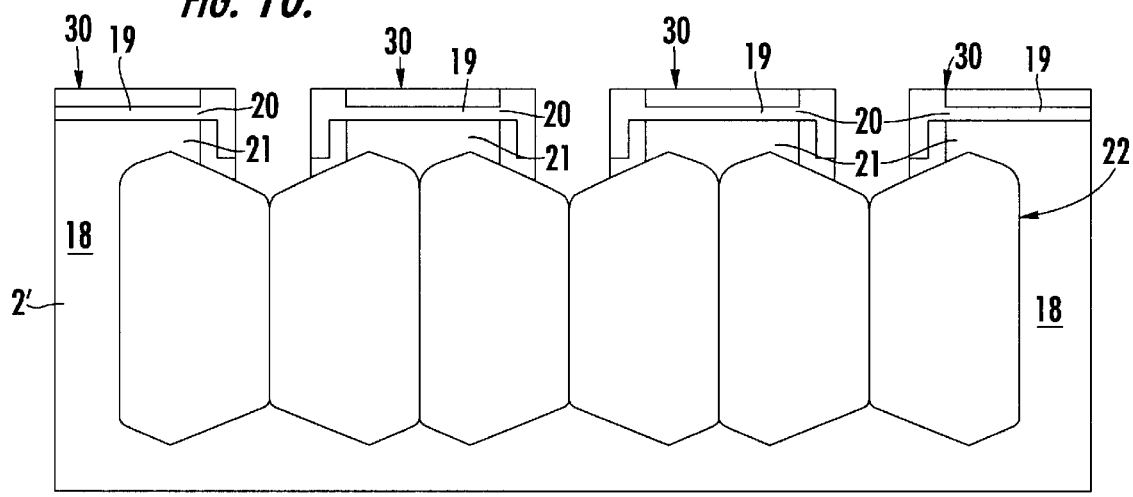

The method continues with a selective oxidation step similar to that of the known process described with reference to FIG. 6. The portions of the substrate of reduced thickness, that is, the portions of the pillars 18' which are not protected by the mask 30, are converted into silicon dioxide. The resulting structure shown in cross-section in FIG. 10, is similar to that of FIG. 6 produced by the known method. However, advantageously, the method according to the invention permits greater freedom in the selection of the dimensional ratios between the trenches 16 and the pillars 18, ensuring the necessary crystallographic quality of the epitaxial layer grown and the formation of a continuous buried oxide layer. Moreover, with the method according to the invention, the most suitable ratio between the width of the trenches 16 and the thickness of the pillars 18 to be oxidized may be selected at the time in question, by adjustment of the isotropic etching time.

What is claimed is:

1. A method of manufacturing a silicon on insulator (SOI) wafer, comprising the steps of:

selective anisotropic etching to form trenches, in a monocrystalline silicon substrate, which extend to a predetermined depth from an upper surface of the substrate and which define portions of the substrate therebetween;

selective isotropic etching to enlarge the trenches, beginning at a predetermined distance from the upper surface, thus reducing the thicknesses of the portions of the substrate between adjacent trenches;

selective oxidation to convert the substrate portions of reduced thickness into silicon dioxide and to fill the trenches with silicon dioxide, substantially from the predetermined distance from the upper surface to thereby obtain silicon tip portions on the silicon dioxide; and epitaxially growing silicon around and above the silicon tip portions to form a silicon layer on the upper surface of the substrate.

2. A method according to claim 1, wherein the selective anisotropic etching comprises the formation of a mask of material resistant to etching and protective against oxidation of the silicon.

3. A method according to claim 2, wherein, after at least part of the anisotropic etching, the mask is extended to side walls of the trenches as far as the predetermined depth.

4. A method according to claim 2, wherein the mask comprises a silicon nitride layer.

5. A method according to claim 2, wherein the mask comprises a silicon dioxide layer produced by decomposition of tetraethyl orthosilicate (TEOS).

6. A method according to claim 1, wherein the step of selective isotropic etching is performed with xenon difluoride gas.

7. A method of manufacturing a silicon on insulator (SOI) wafer, comprising the steps of:

forming trenches and pillar portions therebetween in a silicon substrate by selectively anisotropically etching the substrate;

enlarging the trenches by selectively isotropically etching the pillar portions;

converting the pillar portions into silicon dioxide and filling the trenches with silicon dioxide by selectively oxidizing the pillar portions to thereby obtain silicon tip portions on the silicon dioxide; and epitaxially growing silicon around and above the silicon tip portions to form a silicon layer over the substrate.

8. A method according to claim 7, wherein an amount of time for selectively isotropically etching the pillar portions is adjusted to select predetermined dimensional ratios between the trenches and the pillar portions.

9. A method according to claim 7, wherein the trenches extend to a predetermined depth from an upper surface of the substrate and define the pillar portions therebetween.

10. A method according to claim 9, wherein the selective isotropic etching of the pillar portions is begun at a predetermined distance from the upper surface of the substrate, thus reducing the thicknesses of the pillar portions between adjacent trenches.

11. A method according to claim 10, wherein the pillar portions are selectively oxidized substantially from the predetermined distance from the upper surface to the predetermined depth from the upper surface.

12. A method according to claim 7, wherein the step of forming the trenches and pillar portions comprises forming a mask of material resistant to etching and protective against oxidation of the silicon.

13. A method according to claim 12, wherein the mask is extended to side walls of the trenches as far as a predetermined depth.

14. A method according to claim 12, wherein the mask comprises a silicon nitride layer.

15. A method according to claim 12, wherein the mask comprises a silicon dioxide layer produced by decomposition of tetraethyl orthosilicate (TEOS).

16. A method according to claim 7, wherein the selective isotropic etching of the pillar portions is performed with xenon difluoride gas.

17. A method of manufacturing a silicon on insulator (SOI) wafer, comprising the steps of:

forming trenches and pillar portions therebetween in a monocrystalline silicon substrate by selectively anisotropically etching the substrate;

enlarging the trenches by selectively isotropically etching the pillar portions to select predetermined dimensional ratios between the trenches and the pillar portions;

converting the pillar portions into silicon dioxide and filling the trenches with silicon dioxide by selectively oxidizing the pillar portions to thereby obtain silicon tip portions on the silicon dioxide; and forming a silicon layer over the substrate.

18. A method according to claim 17, wherein the trenches extend to a predetermined depth from an upper surface of the substrate and define the pillar portions therebetween.

19. A method according to claim 18, wherein the selective isotropic etching of the pillar portions is begun at a predetermined distance from the upper surface of the substrate, thus reducing the thicknesses of the pillar portions between adjacent trenches.

20. A method according to claim 19, wherein the pillar portions are selectively oxidized substantially from the predetermined distance from the upper surface to the predetermined depth from the upper surface.

21. A method according to claim 17, wherein the step of forming the trenches and pillar portions comprises forming a mask of material resistant to etching and protective against oxidation of the silicon.

22. A method according to claim 21, wherein the mask is extended to side walls of the trenches as far as a predetermined depth.

23. A method according to claim 21, wherein the mask comprises a silicon nitride layer.

24. A method according to claim 21, wherein the mask comprises a silicon dioxide layer produced by decomposition of tetraethyl orthosilicate (TEOS).

25. A method according to claim 17, wherein the selective isotropic etching of the pillar portions is performed with xenon difluoride gas.

* * * * *

UNITED STATES PATENT AND TRADEMARK OFFICE
CERTIFICATE OF CORRECTION

PATENT NO. : 6,350,657 B1
DATED : February 26, 2002
INVENTOR(S) : Ubaldo Mastromatteo, Flavio Villa and Gabriele Barlocchi It is certified that error appears in the above-identified patent and that said Letters Patent is hereby corrected as shown below:

<u>Title page,</u>
Item [30], Foreign Application Priority Data, delete "98830475" insert -- 9830476 --

Signed and Sealed this

Twelfth Day of November, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

| | | |
|---|---|---|
| PATENT NO. | : 6,350,657 B1 | Page 1 of 1 |
| DATED | : February 26, 2002 | |
| INVENTOR(S) | : Ubaldo Mastromatteo, Flavio Villa and Gabriele Barlocchi | |

It is certified that error appears in the above-identified patent and that said Letters Patent is hereby corrected as shown below:

<u>Title page,</u>
Item [30], Foreign Application Priority Data, delete "98830475" insert -- 98830476 --

This certificate supersedes Certificate of Correction issued November 12, 2002

Signed and Sealed this

Eleventh Day of February, 2003

JAMES E. ROGAN
*Director of the United States Patent and Trademark Office*